(12) United States Patent
Lin et al.

(10) Patent No.: US 11,346,875 B2
(45) Date of Patent: *May 31, 2022

(54) MICRO RESONATOR ARRAY SENSOR FOR DETECTING WAFER PROCESSING PARAMETERS

(71) Applicant: APPLIED MATERIALS, INC., Santa Clara, CA (US)

(72) Inventors: Chuang-Chia Lin, San Ramon, CA (US); Upendra Ummethala, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 120 days.

This patent is subject to a terminal disclaimer.

(21) Appl. No.: 16/283,364

(22) Filed: Feb. 22, 2019

(65) Prior Publication Data

US 2019/0265286 A1    Aug. 29, 2019

Related U.S. Application Data

(60) Provisional application No. 62/636,071, filed on Feb. 27, 2018.

(51) Int. Cl.
| | | |
|---|---|---|
| *G01R 29/08* | (2006.01) | |
| *H01L 21/66* | (2006.01) | |
| *H01Q 1/38* | (2006.01) | |

(52) U.S. Cl.
CPC ..... *G01R 29/0878* (2013.01); *G01R 29/0892* (2013.01); *H01L 22/12* (2013.01);
(Continued)

(58) Field of Classification Search
CPC ................. G01R 29/0878; G01R 29/0892
See application file for complete search history.

(56) References Cited

U.S. PATENT DOCUMENTS

| | | |
|---|---|---|
| 6,384,697 B1 | 5/2002 | Ruby |
| 6,621,134 B1 | 9/2003 | Zurn |

(Continued)

FOREIGN PATENT DOCUMENTS

| | | |
|---|---|---|
| KR | 1020040110979 A | 12/2004 |
| TW | I394365 | 4/2013 |

(Continued)

OTHER PUBLICATIONS

International Search Report and Written Opinion from PCT/US2019/019456 dated Jun. 13, 2019, 12 pgs.

(Continued)

*Primary Examiner* — Reena Aurora
(74) *Attorney, Agent, or Firm* — Schwabe, Williamson & Wyatt, P.C.

(57) ABSTRACT

Embodiments include systems and methods for determining a processing parameter of a processing operation. Embodiments include a diagnostic substrate for determining processing parameters of a processing operation. In an embodiment, the diagnostic substrate comprises a substrate, a circuit layer over the substrate, and a capping layer over the circuit layer. In an embodiment, a micro resonator sensor is in the circuit layer and the capping layer. In an embodiment, the micro resonator sensor comprises, a resonating body and one or more electrodes for inducing resonance in the resonating body.

20 Claims, 11 Drawing Sheets

(52) U.S. Cl.
CPC .............. *H01L 22/14* (2013.01); *H01L 22/34* (2013.01); *H01Q 1/38* (2013.01)

(56) References Cited

U.S. PATENT DOCUMENTS

| | | | |
|---|---|---|---|
| 7,402,449 B2* | 7/2008 | Fukuda | ............... B81C 1/00246 |
| | | | 438/53 |
| 8,981,875 B2 | 3/2015 | Park | |
| 11,009,538 B2* | 5/2021 | Lin | ................... G01R 29/0892 |
| 2006/0275946 A1* | 12/2006 | MacNamara | ......... H01L 23/481 |
| | | | 438/73 |
| 2007/0188269 A1 | 8/2007 | Lutz et al. | |
| 2010/0301954 A1 | 12/2010 | Fukuda | |
| 2013/0033340 A1 | 2/2013 | Kim et al. | |
| 2013/0140651 A1 | 6/2013 | Chen et al. | |
| 2017/0263511 A1* | 9/2017 | Tedeschi | ................. H01L 22/12 |

FOREIGN PATENT DOCUMENTS

| | | |
|---|---|---|
| TW | I424616 | 1/2014 |
| WO | WO 2004/037711 | 5/2004 |
| WO | WO 2017/041056 | 3/2017 |

OTHER PUBLICATIONS

Official Letter from Taiwan Patent Application No. 108106709 dated Dec. 10, 2019, 10 pgs.
International Preliminary Report on Patentability from PCT/US2019/019456 dated Sep. 3, 2020, 8 pgs.
Official Letter from Taiwan Patent Application No. 109126009 dated May 4, 2021, 6 pgs.

* cited by examiner

MICRO RESONATOR ARRAY SENSOR FOR DETECTING WAFER PROCESSING PARAMETERS

CROSS-REFERENCE TO RELATED APPLICATIONS

This application claims the benefit of U.S. Provisional Application No. 62/636,071, filed on Feb. 27, 2018, the entire contents of which are hereby incorporated by reference herein.

BACKGROUND

1) Field

Embodiments relate to the field of semiconductor manufacturing and, in particular, to systems and methods for monitoring processing parameters of semiconductor fabrication operations. Embodiments include arrays of micro resonators that are monitored for changes in resonance frequency at various resonance modes.

2) Description of Related Art

The scale of critical dimension (CD) and other feature sizes in many semiconductor devices is continually shrinking. Extensive process development is needed in order to develop reliable processes with high repeatability. Typically, a process is developed by running the process on test substrates. The test substrates are then analyzed with various metrology tools in order to determine the results of the process. For example, cross-sections of the substrate may be analyzed to determine the amount of material removed with an etching process or material added with a deposition process.

The use of such test substrates and post processing metrology has several drawbacks. One drawback is that the cross-sectioning and analysis takes significant time (e.g., days or longer). Additionally, the cross-sectioning requires significant work for each location. As such, only a limited number of cross-sections can be analyzed for each process. Another drawback is that only the end result of the process is able to be analyzed. This limits the information that may be obtained about the process. For example, the rate of change of a process is not determinable from the end result of cross-sections of the test substrate.

SUMMARY

Embodiments include a diagnostic substrate for determining processing parameters of a processing operation. In an embodiment, the diagnostic substrate comprises a substrate, a circuit layer over the substrate, and a capping layer over the circuit layer. In an embodiment, a micro resonator sensor is in the circuit layer and the capping layer. In an embodiment, the micro resonator sensor comprises, a resonating body and one or more electrodes for inducing resonance in the resonating body.

Additional embodiments include a diagnostic substrate that comprises a substrate, a circuit layer over the substrate, and a cavity in the circuit layer. In an embodiment, a capping layer is over the circuit layer. In an embodiment, the cavity is sealed by a portion of the capping layer. In an embodiment, the diagnostic substrate further comprises a micro resonator in the cavity. In an embodiment, the micro resonator comprises a resonating body that is mechanically coupled to the portion of the capping layer sealing the cavity and one or more electrodes for inducing resonance in the resonating body.

Additional embodiments include a diagnostic substrate that comprises a substrate, a circuit layer over the substrate, a capping layer over the circuit layer, and a plurality of sensing regions across the diagnostic substrate. In an embodiment, each sensing region comprises a plurality of cavities formed into the circuit layer, a plurality of electrodes formed in each of the cavities, and a resonating body over or within each of the cavities.

DETAILED DESCRIPTION

Figure 1A:
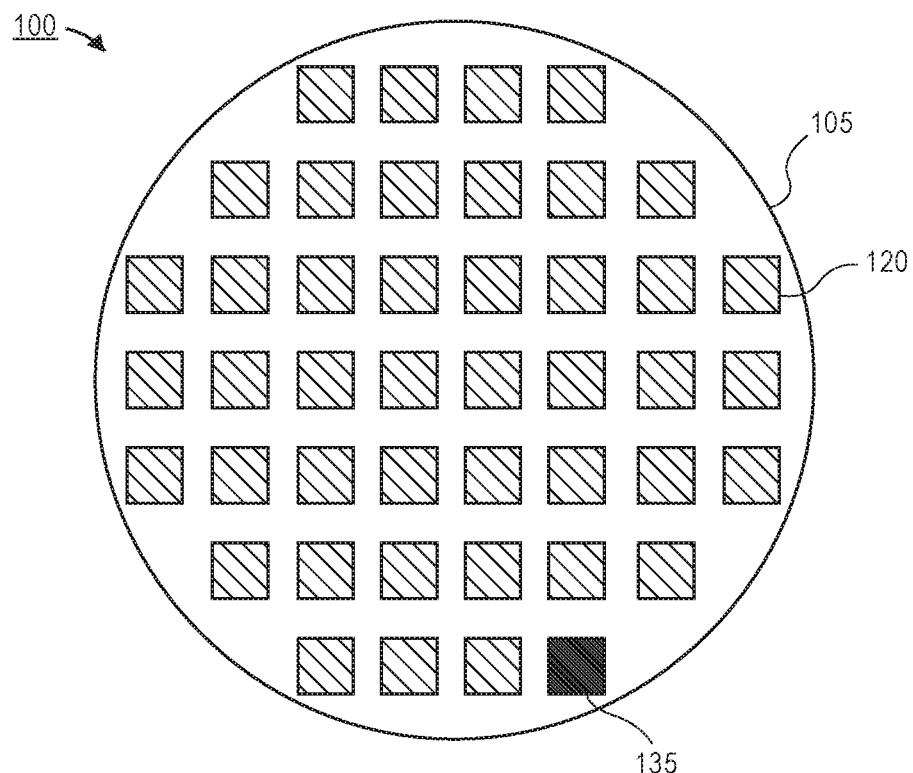
FIG. 1A is a schematic plan view of sensing regions on a substrate, in accordance with an embodiment.

Systems and methods described herein include diagnostic substrates for monitoring processing parameters of a processing operation. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, the current timeline for developing a processing operation, such as an etching process, a deposition process, a polishing process, an implantation process, or the like, is long due to the labor intensive metrology needed to determine processing parameters. Embodiments described herein accelerate the process development by using diagnostic substrates. Diagnostic substrates described herein include a plurality of micro resonator sensors distributed across the substrate. Accordingly, process parameters and their degree of uniformity across the substrate surface may be obtained without requiring many cross-sections.

In some embodiments the plurality of micro resonator sensors may be grouped into sensing regions across the substrate surface. For example, hundreds of sensing regions, each including thousands or tens of thousands of micro resonator sensors, may be formed on the diagnostic substrate. In such embodiments, the micro resonators in each sensing region may be used to provide a high signal to noise ratio. Accordingly, embodiments allow for high resolution even when dealing with critical dimensions (CD) at the tens of nanometer scale. In some embodiments, changes in CD in the range of angstroms to several nanometers with an accuracy in the parts per million (PPM) may be detected.

Furthermore, embodiments may include diagnostic substrates that may be utilized to provide in-situ monitoring of the processing operation. In-situ monitoring allows for monitoring processing parameters during the processing operation. As such, the rate of change of a processing parameter may be determined as well. Embodiments may include a wireless module that transmits information from the diagnostic substrate in real time. Alternatively, the information from the micro resonator sensors may be stored in a memory on the diagnostic substrate and processed subsequent to the processing operation.

In some embodiments, the micro resonator sensors may comprise a resonating body, such as a diaphragm that extends over a cavity. The diaphragms may be directly modified with the processing operation (e.g., deposition, etching, polishing, implantation or the like). Changes to the diaphragm result in changes to a resonant frequency of the diaphragm. The changes in the resonant frequency may then be used to determine the physical change to the surface of the diaphragm, to monitor conditions of the diaphragm, (e.g., temperature, surface potential, etc.) or to monitor external environmental conditions (e.g., pressure surrounding the diaphragm, etc.).

In other embodiments, the micro resonator sensors may comprise a resonating body that is within a cavity that is sealed by a capping layer. The resonating body may be mechanically coupled to the capping layer with one or more anchors. The one or more anchors may allow for acoustic energy to be transmitted between the resonating body and the capping layer (which function as a diaphragm over the cavity). Accordingly, physical (or environmental) changes to the capping layer during a processing operation may be indirectly measured by detecting changes to the resonating body that is mechanically coupled to the capping layer. Such embodiments provide flexibility in the design of the resonating body that allows for architectures that make it easier to drive or receive high quality resonance modes. Additionally, the capping layer seals the cavity and protects the resonating body from the processing environment. This protects the resonating body from environmental influences that would otherwise negatively alter the resonance. Accordingly, embodiments with a buried resonator body allow for higher quality factors, lower losses, etc.

Referring now to FIG. 1A, a schematic plan view illustration of a diagnostic substrate 100 is shown, in accordance with an embodiment. In an embodiment, the diagnostic substrate 100 may be formed on a substrate 105. The substrate 105 may be any suitable substrate on which sensing regions 120 may be fabricated. For example, the substrate 105 may be a semiconductor substrate, such as silicon, a silicon on insulator (SOI), a glass substrate, or the like. In an embodiment, the substrate 105 may be considered a wafer (e.g., a 300 mm silicon wafer or the like). The substrate 105 may be substantially the same dimensions as a production substrate used to fabricate functioning devices using a processing operation being developed with the diagnostic substrate 100. Furthermore, the diagnostic substrate 100 may comprise a surface that matches that of device substrates. For example, the exposed surface (i.e., across the entire substrate including the sensing regions 120) may comprise a single crystalline silicon (or other semiconductor) material. Such a pristine surface allows for low surface roughness, suitable for providing measurements of CD at the angstrom to nanometer scales. Furthermore, since the surface of the diagnostic substrate 100 matches that of device substrates on which functioning semiconductor devices are fabricated, accurate comparison to typical semiconductor processing operations may be provided.

Additionally, while referred to as a diagnostic substrate, it is to be appreciated that embodiments may also include sensing regions 120 on device substrates. In such embodiments, the sensing regions 120 may be used during the fabrication of functioning devices in order to provide metrology or other quality control measures concurrent with the device fabrication.

According to an embodiment, the diagnostic substrate 100 may include a plurality of sensing regions 120. The sensing regions 120 may be distributed across the surface of the substrate 105. Including sensing regions 120 at different locations allows the uniformity of a processing operation to be determined. It is to be appreciated that the sensing regions 120 illustrated in FIG. 1A are exemplary in nature. The sensing regions 120 may be of any number and in any distribution over the surface of the substrate 105. In some embodiments, there may be more than one hundred sensing regions 120 distribute over the surface of the substrate 120.

Embodiments may also include one or more processing regions 135 on the diagnostic substrate 100. In an embodiment, the processing regions 135 may be communicatively coupled to the sensing regions (e.g., with conductive traces, vias or the like). In an embodiment, the processing regions 135 may include circuitry, logic modules, memory modules, signal processing modules, communication modules, or the like. The processing regions 135 may be used to drive electrodes (described in greater detail below) that will drive the resonance of resonating bodies in micro resonators in each sensing region 120. The processing regions 135 may record resonant frequencies of each micro resonator. The processing regions 135 may also determine a processing parameter from the resonant frequencies using methods described in greater detail below. In other embodiments, the determination of the processing parameters from the resonant frequencies may be implemented on a computing system external to the diagnostic substrate. For example, the raw (or processed) data from each micro resonator may be transmitted (e.g., with a wireless communication module) to an external device for further analysis. In an embodiment, the communication link may be implemented using RF (e.g., WiFi, Bluetooth, etc.), acoustic communications, inductive communication, or optical communication (e.g., fiber optics), or any other suitable communication protocol.

In some embodiments, the diagnostic substrate 100 may comprise only passive components. That is, the diagnostic substrate 100 may comprise micro resonators that are communicatively coupled to an external device with an antenna or the like. The micro resonators may be driven and sensed with the external device. For example, a wireless link for transmitting power and data between the external device and the micro resonators may be provided on the diagnostic substrate 100.

In the illustrated embodiment, the processing region 135 is illustrated as being formed on a top surface of the substrate 105. However, it is to be appreciated that the processing regions 135 may be embedded within the substrate 105 or formed on a backside surface of the substrate 105. In an embodiment, the processing region 135 may also include a power source. For example, the power source may be a battery, or the like. In other embodiments, the power source may be a wireless power source. For example, the power source may comprise conductive coils, antennas, or the like to enable inductive power coupling or an acoustic power coupling. In some embodiments, the wireless power source may also be configured to provide a data link. That is, frequencies of the micro resonators may be transmitted to an external device using wireless coupling (e.g., acoustic coupling, inductive coupling, etc.).

Figure 1B:
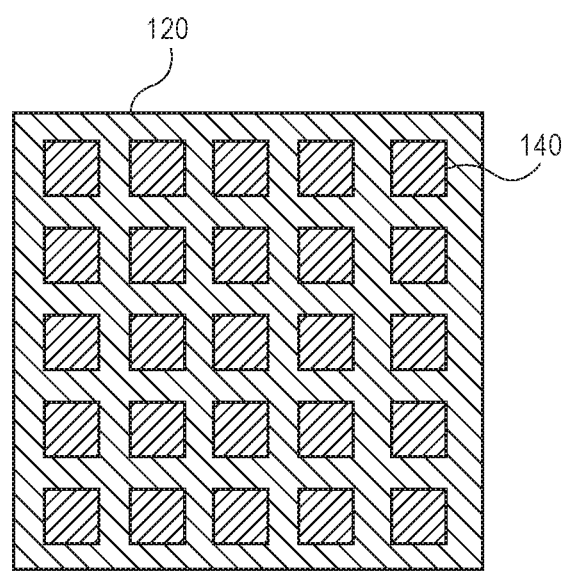
FIG. 1B is a zoomed in schematic plan view of a sensing region illustrating an array of micro resonator sensors, in accordance with an embodiment.

Referring now to FIG. 1B, a zoomed in schematic illustration of a sensing region 120 is shown, in accordance with an embodiment. Each sensing region 120 may include a plurality of micro resonator sensors 140. In the illustrated embodiment, twenty-five micro resonator sensors 140 are shown for simplicity. However, it is to be appreciated that thousands of micro resonator sensors 140 may be formed in each sensing region 120. For example, each of the micro resonator sensors 140 may have a surface area of approximately 50 $\mu m^2$. In such embodiments, forty thousand micro resonator sensors 140 may be formed in a sensing region of 100 $mm^2$. It is to be appreciated that the dimensions and number of micro resonator sensors 140 and the dimensions of the sensing regions 120 are exemplary in nature, and embodiments include micro resonators with dimensions greater than or less than 50 $\mu m^2$ and sensing regions with dimensions greater than or less than 100 $mm^2$.

The large number of micro resonator sensors 140 in each sensing region 120 allows for high signal to noise ratios through noise reduction. As such, small changes to the processing parameter being investigated may be determined. For example, changes of angstroms to several nanometers in the CD of an etched structure may be discernable, in accordance with embodiments described herein. Embodiments described herein may include micro resonator sensors that have resonance frequencies of tens of MHz. In such resonators, trenches with a 1:1 trench:ridge ratio with a depth of 50 nm may induce a shift in the resonance frequency of approximately 1 to 2 MHz. Furthermore, a small changes (e.g., angstroms to nanometers) to the width of the trench may induce a resonance change of approximately 10 Hz to 1,000 Hz. Similarly, variations in temperature, surface potential, and/or pressure also drive resonance changes. For example, a single degree of temperature change may produce change in resonance frequency between 10 Hz and 1,000 Hz, or a change of one volt in surface potential may result in a change of resonance frequency between 10 Hz and 1,000 Hz. Such frequency variations are easily detectible with modern electronics and enable PPM accuracy.

Figure 2A:
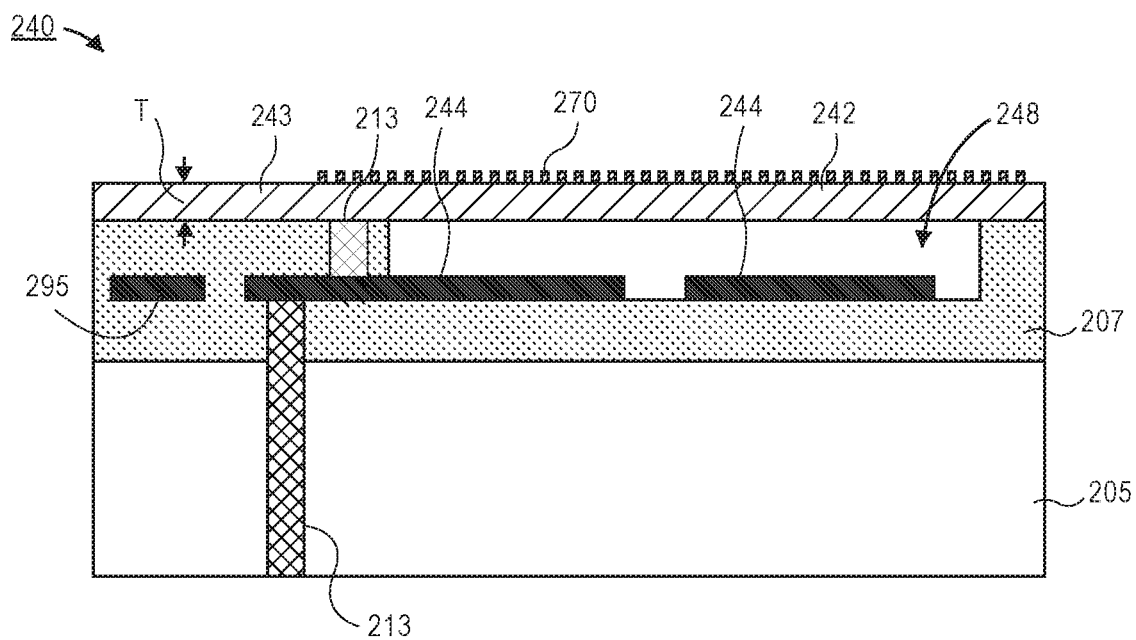
FIG. 2A is a cross-sectional illustration of a micro resonator with a resonating body that is a diaphragm formed over a cavity, in accordance with an embodiment.

Referring now to FIG. 2A, a cross-sectional illustration of a micro resonator sensor 240 is shown, in accordance with an embodiment. The micro resonator sensor 240 may be formed over and into a circuit layer 207 formed over the substrate 205. In an embodiment, the circuit layer 207 layer may comprise layers of insulating and conductive materials (e.g., traces, vias, etc.). While referred to herein as a "circuit layer" 207, it is to be appreciated that the circuit layer 207 may comprise only passive components in some embodiments. In other embodiments, the circuit layer 207 may include active components as well. In an embodiment, the micro resonator sensor 240 includes a capping layer 243 over the circuit layer 207. In some embodiments, the capping layer 243 may be a pristine semiconductor layer. For example, the capping layer 243 may be silicon. In an embodiment, the capping layer 243 may have a thickness T. For example, the thickness T may be between 1 micron and 100 microns. In an embodiment, the capping layer 243 may comprise a diaphragm 242 that extends over a cavity 248 formed into the circuit layer 207. That is, the diaphragm 242 may be considered to be part of the capping layer 243, and does not extend up from the capping layer 243. It is to be appreciated that the diaphragm 242 is one example of a micro resonator sensor 240. Embodiments include any resonator system. For example, the micro resonator 240 may include cantilevered beams, comb drives, or the like.

The diaphragm 242 may be driven to a resonant frequency by a plurality of electrodes 244 formed on a bottom surface of the cavity 248. In an embodiment, the plurality of electrodes 244 may be electrically coupled to the processing region 135 (not shown in FIG. 2) by electrical traces and vias 213. In an embodiment, a through substrate via 213 may be used to electrically couple the electrodes 244 to a backside surface of the substrate 205. In an embodiment, the electrodes 244 may be electrically coupled to the capping layer 242 with one or more vias 213, traces, or the like. In an embodiment, the plurality of electrodes 244 may be drive/sense electrodes. As such, the electrodes 244 may be used to drive the diaphragm 242 and to detect the resonance frequencies of the diaphragm 242 during the processing of the diaphragm 242. In an embodiment, the plurality of electrodes 244 may use capacitance to drive the diaphragm 242. However, it is to be appreciated that the resonance of the micro resonator 240 may be obtained with any suitable mechanism. For example, the micro resonator 240 may be driven with magnetic drive systems, thermal systems, acoustic systems, optical systems, or the micro resonator 240 may include piezo electric materials that induce resonance.

In an embodiment, a patterning mask 270 may be formed over the diaphragm 242. The patterning mask 270 may be used to mask portions of the diaphragm 242 from a processing environment, such as an etching environment. During the processing operation that is being investigated with the diagnostic substrate 100, the pattern of the patterning mask 270 may be transferred into the diaphragm. As the diaphragm 242 is processed (e.g., etched), the resonance frequencies of the diaphragm 242 will change in predictable ways. The changes in resonance frequencies may then be used to calculate the physical changes in the diaphragm 242, as will be described in greater detail below.

In some embodiments, a passive coupling antenna 295 may be used to wirelessly drive and sense the resonance of the micro resonator sensor 240. For example, the antenna 295 may be formed in the circuit layer 207. The use of a passive coupling antenna 295 allows for the contactless communication of the resonance frequencies to an external device and/or for contactless power delivery. Additionally, in some embodiments no active devices are included in the diagnostic substrate 200 when a passive coupling antenna 295 is associated with each micro resonator sensor 240.

Figure 2B:
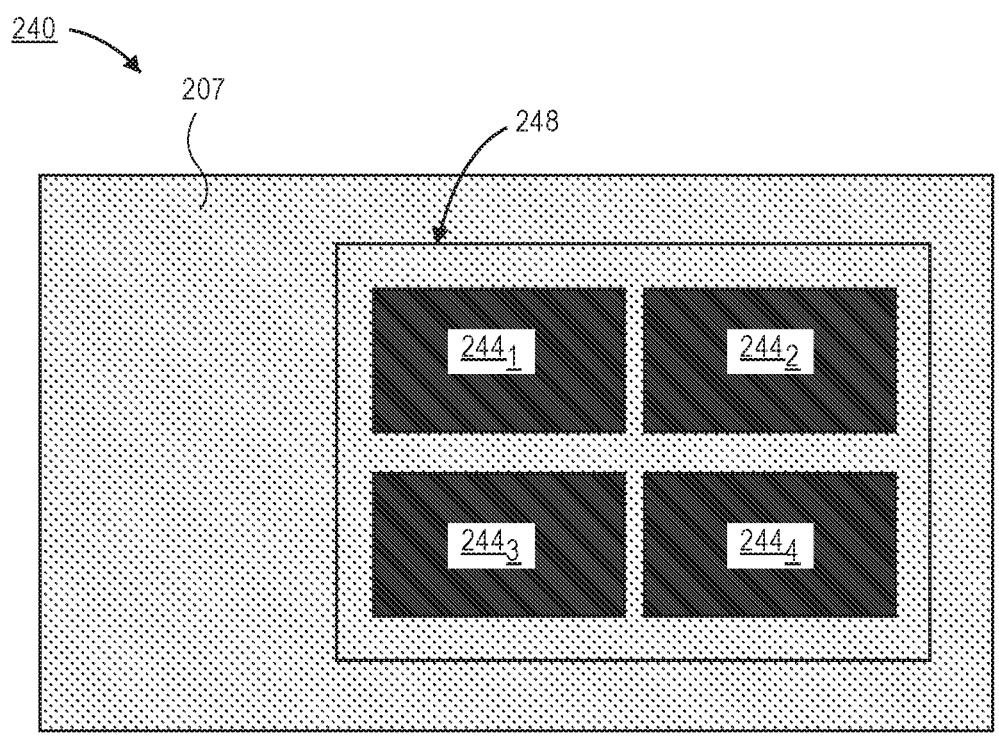
FIG. 2B is a plan view of a plurality of electrodes formed in the cavity of a micro resonator, in accordance with an embodiment.

Referring now to FIG. 2B, a plan view illustration of the cavity 248 in the circuit layer 207 is shown, in accordance with an embodiment. In the illustrated embodiment, the cavity 248 includes a rectangular shape. However, embodiments are not limited to such configurations, and the cavity 248 may be any desired shape, such as a square, circular, elliptical, or any other desired shape. As shown, the plurality of electrodes 244 are formed in the cavity 248. In embodiments, the number and arrangement of the electrodes 244 allows for different resonance modes to be induced in the diaphragm 242. The diaphragm 242 is not shown in FIG. 2B in order to not obscure the underlying features.

In the illustrated embodiment, four electrodes are shown. When four electrodes are included in the cavity 248, the diaphragm may be driven to at least three different resonance modes. A first resonance mode may be obtained by activating all four electrodes $244_1$-$244_4$ in unison. A second resonance mode may be obtained by alternating the activation of electrodes $244_1$ and $244_2$ with the activation of electrodes $244_3$ and $244_4$. A third resonance mode may be obtained by alternating the activation of electrodes $244_1$ and $244_3$ with the activation of electrodes $244_2$ and $244_4$. It is to be appreciated that additional resonance modes may be obtained by activating different combinations of electrodes 244.

Referring now to FIGS. 3A-3H, a cross-sectional illustrations and plan view illustrations of micro resonators 340 are shown, in accordance with additional embodiments. Particularly, the micro resonators 340 are different from the micro resonator 240 shown in FIG. 2A in that the resonating body 345 is sealed within the cavity 348. In each of the micro resonators 340 shown in FIGS. 3A-3H, the resonating body 345 is within the cavity 348 and the cavity 348 is sealed by a capping layer 343. Accordingly, the resonating body 345 is protected from the processing environment being investigated. Furthermore, the capping layer 343 may provide a vacuum seal of the cavity 348, which results in the resonating body 345 being located in a vacuum environment. This reduces losses of the resonating body 345.

Figure 3A:
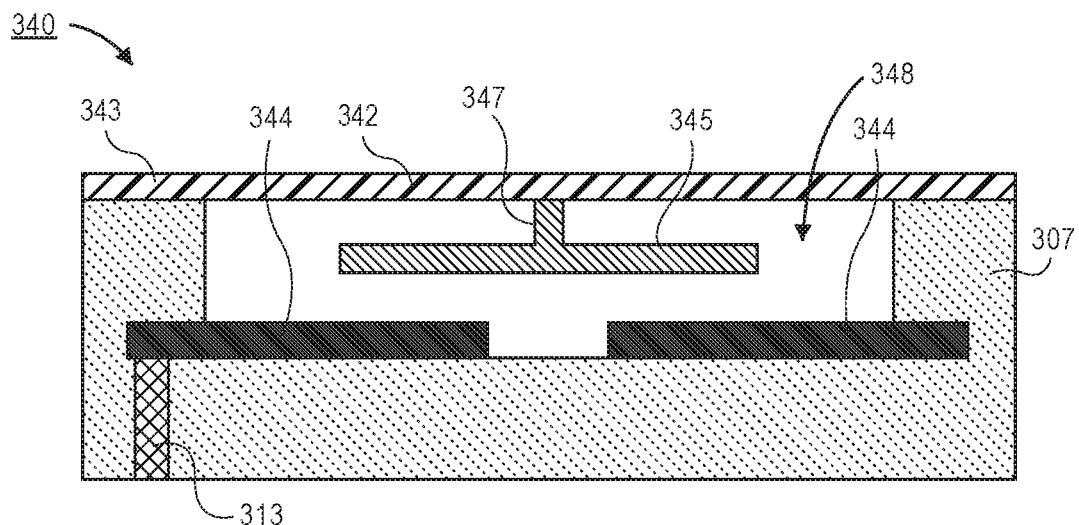
FIG. 3A is a cross-sectional illustration of a micro resonator that comprises a resonating body mechanically coupled to a lid over a cavity, in accordance with an embodiment.

Referring now to FIG. 3A, a cross-sectional illustration of a micro resonator 340 is shown, in accordance with an embodiment. In an embodiment, the micro resonator 340 may be positioned in a cavity 348 within a semiconductor layer 307 of the diagnostic substrate. The micro resonator 340 may comprise a resonating body 345. The resonating body 345 may be driven to a resonant frequency by one or more electrodes 344. As shown, the electrodes 344 in FIG. 3A are out of plane with the resonating body 345. That is, the electrodes 344 are positioned along a floor of the cavity 348 below the resonating body 345. The electrodes 344 may be electrically coupled to a processing region (not shown) with conductive vias 313, traces or the like. In other embodiments, the electrodes 344 may be wirelessly coupled to an external device with an antenna (not shown) or the like.

In an embodiment, a capping layer 343 is formed from the material that is being investigated with the diagnostic substrate. For example, if the diagnostic substrate is being used to develop an etching process of a silicon layer, then the capping layer 343 will be silicon. In an embodiment, the capping layer 343 may comprise a diaphragm 342 that extends across the cavity 348. The diaphragm 342 seals the cavity 342. For example, the seal may be a vacuum seal.

In an embodiment, the resonating body 345 is mechanically coupled to the diaphragm 342 of the capping layer 343 with one or more anchors 347. That is, acoustic energy may be transmitted between the diaphragm 342 and the resonating body 345 via the one or more anchors 347. Accordingly, changes (e.g., CD changes, temperature changes, surface charge changes, pressure changes, or the like) to the diaphragm 342 (i.e., as the result of a processing operation, such as an etching process, a deposition process, a polishing process, an implantation process, or the like) will result in changes to the resonant frequency of the resonating body 345.

Figure 3B:
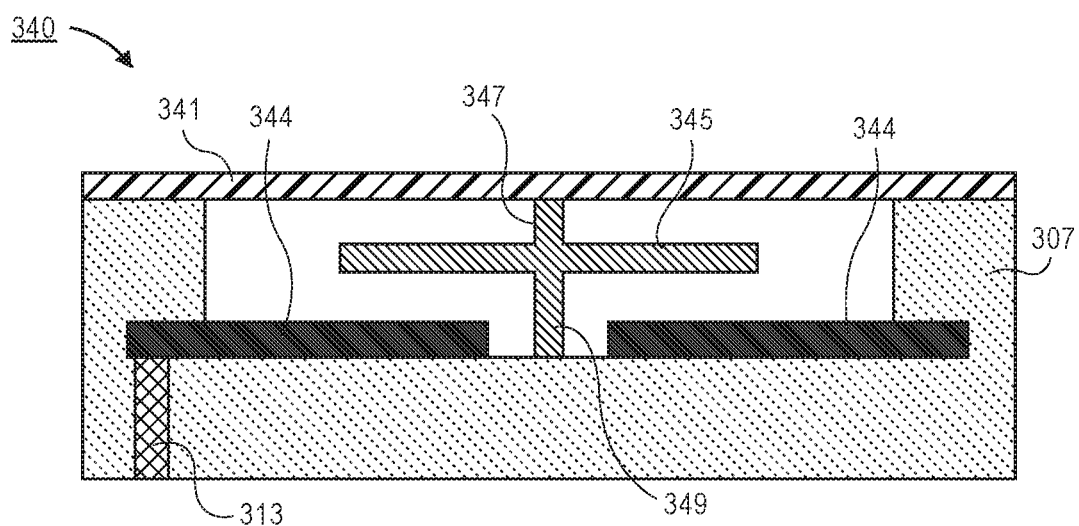
FIG. 3B is a cross-sectional illustration of a micro resonator that comprises a resonating body mechanically coupled to a lid over a cavity and a floor of the cavity, in accordance with an embodiment.

Referring now to FIG. 3B, a cross-sectional illustration of a micro resonator 340 is shown in accordance with an additional embodiment. The micro resonator 340 in FIG. 3B may be substantially similar to the micro resonator 340 in FIG. 3A, with the exception that an additional anchor 349 is provided. As shown, the resonating body 345 may also be mechanically coupled to a floor of the cavity 348 with the anchor 349.

Figure 3C:
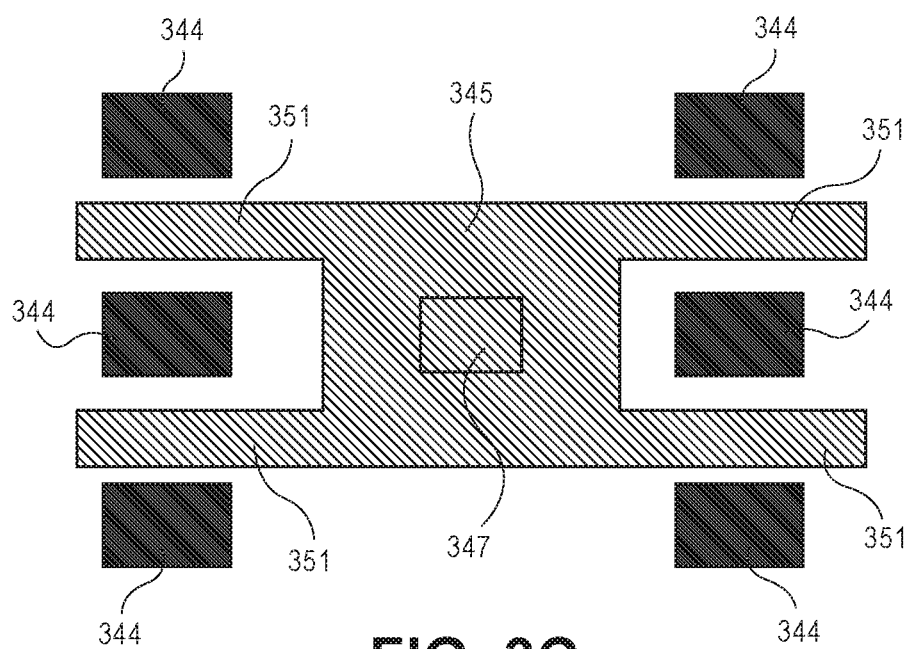
FIG. 3C is a plan view illustration of a resonating body with a tuning fork shape, in accordance with an embodiment.

Referring now to FIG. 3C, a plan view illustration of a resonating body 345 is shown, in accordance with an additional embodiment. In an embodiment, the resonating body 345 includes a tuning fork shape. That is, arms 351 may extend out from a central portion of the resonating body 345. An anchor 347 over the central portion of the resonating body 345 may mechanically couple the resonating body 345 to a diaphragm (not shown) above the resonating body 345.

In an embodiment, a plurality of electrodes 344 may surround portions of the resonating body 345. For example the electrodes 344 may be between arms 351 and outside of arms 351. In an embodiment, the electrodes 344 may be in the same plane as the resonating body 345. That is, the resonating body 345 may be driven into resonance along the X-Y plane, as opposed to in the Z-direction, as shown in the micro resonators described above with respect to FIGS. 2A, 3A, and 3B.

Figure 3D:
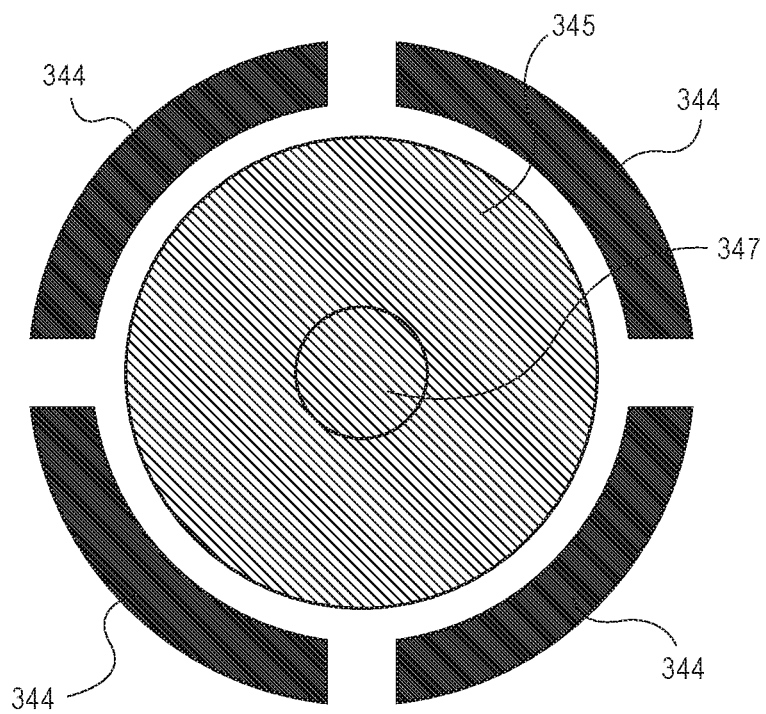
FIG. 3D is a plan view illustration of a resonating body with a disc shape, in accordance with an embodiment.

Referring now to FIG. 3D, a plan view illustration of a resonating body 345 is shown, in accordance with an additional embodiment. In an embodiment, the resonating body 345 may be disc shaped with a plurality of electrodes around the perimeter of the resonating body 345. In an embodiment, a center point of the resonating body 345 may be mechanically coupled to a diaphragm (not shown) above the resonating body 345 by an anchor 347.

Figure 3E:
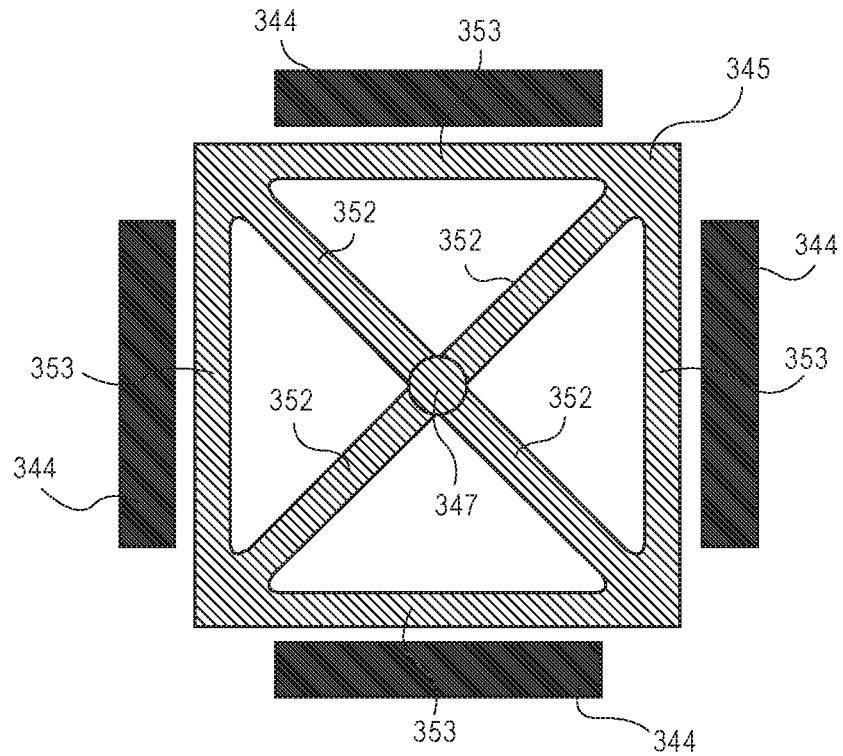
FIG. 3E is a plan view illustration of a resonating body with a ring shape that has a single anchor location, in accordance with an embodiment.

Referring now to FIG. 3E, a plan view illustration of a resonating body 345 is shown, in accordance with an additional embodiment. In an embodiment, the resonating body 345 is a ring having ring members 353 and cross-members 352. The ring members 353 around the perimeter of the resonating body 345 may be driven to resonance by electrodes 344 proximate to each ring member 353. The cross-members 352 may provide a path to a center of the ring where an anchor 347 to the diaphragm (not shown) is located.

Figure 3F:
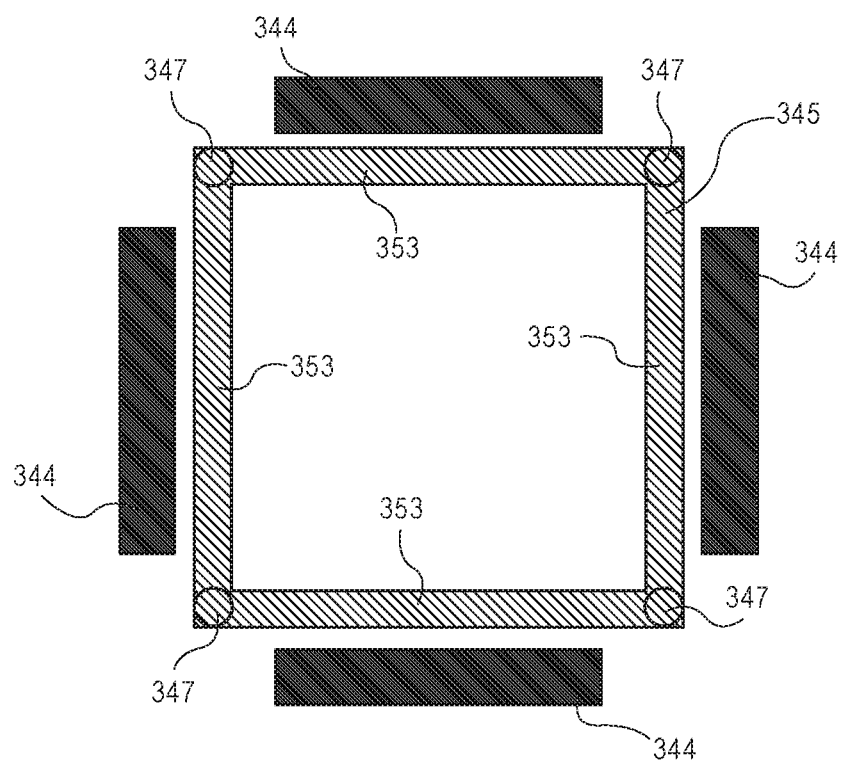
FIG. 3F is a plan view illustration of a resonating body with a ring shape with a plurality of anchor locations, in accordance with an embodiment.

Referring no to FIG. 3F, a plan view illustration of a resonating body 345 is shown, in accordance with an additional embodiment. In an embodiment. Resonating body 345 may comprise ring members 353 that form a perimeter of the resonating body 345. Instead of having cross-members to a center of the ring (as shown in FIG. 3E), the resonating body 345 may comprise a plurality of anchors 347 directly connected to the ring members 353. For example, four anchors 347 (one at each corner of the resonating body 345) provide mechanical coupling to a lid (not shown). While four anchors are shown, it is to be appreciated that any number of anchors 347 may be used. Furthermore, while shown as being positioned at the corners of the resonating body 345, the anchors 347 may be located at any position of the resonating body 345.

Figure 3G:
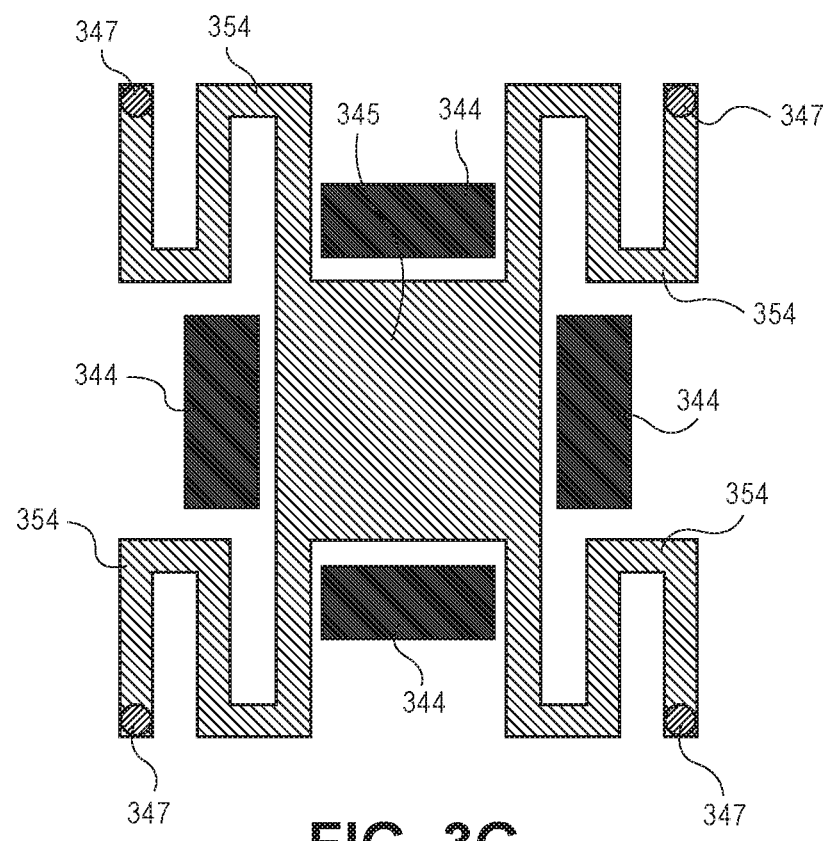
FIG. 3G is a plan view illustration of a resonating body with spring arms, in accordance with an embodiment.

Referring now to FIG. 3G, a plan view illustration of a resonating body 345 is shown, in accordance with an additional embodiment. In an embodiment, the resonating body 345 may comprise a plurality of spring arms 354 that extend out from the central portion of the resonating body 345. The spring arms 354 allow for increased flexibility allowing for greater oscillation of the resonating body 345. In an embodiment, an end of each spring arm 354 may be mechanically coupled to a lid (not shown) with an anchor 347.

Figure 3H:
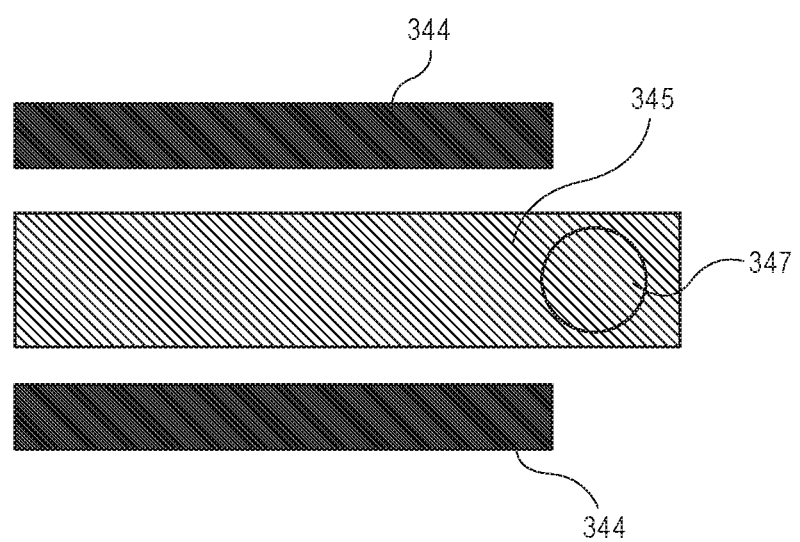
FIG. 3H is a plan view illustration of a resonating body that is a beam with a single anchor, in accordance with an embodiment.

Referring now to FIG. 3H, a plan view illustration of a resonating body 345 is shown, in accordance with an additional embodiment. The resonating body 345 may be a beam that is mechanically coupled to a lid (not shown) with an anchor 347 at one end of the beam. Such a configuration may be referred to as a cantilever beam.

As shown in FIGS. 3A-3H, a plurality of different resonating body 345 configurations are shown. However, it is to be appreciated that embodiments are not limited to such configurations. For example, the resonating bodies 345 may have any shape suitable for driving oscillation, and the positioning and number of electrodes 344 may be any configuration suitable for driving oscillation. That is, the embodiments illustrated in FIGS. 3A-3H are merely exemplary in nature.

Figure 4:
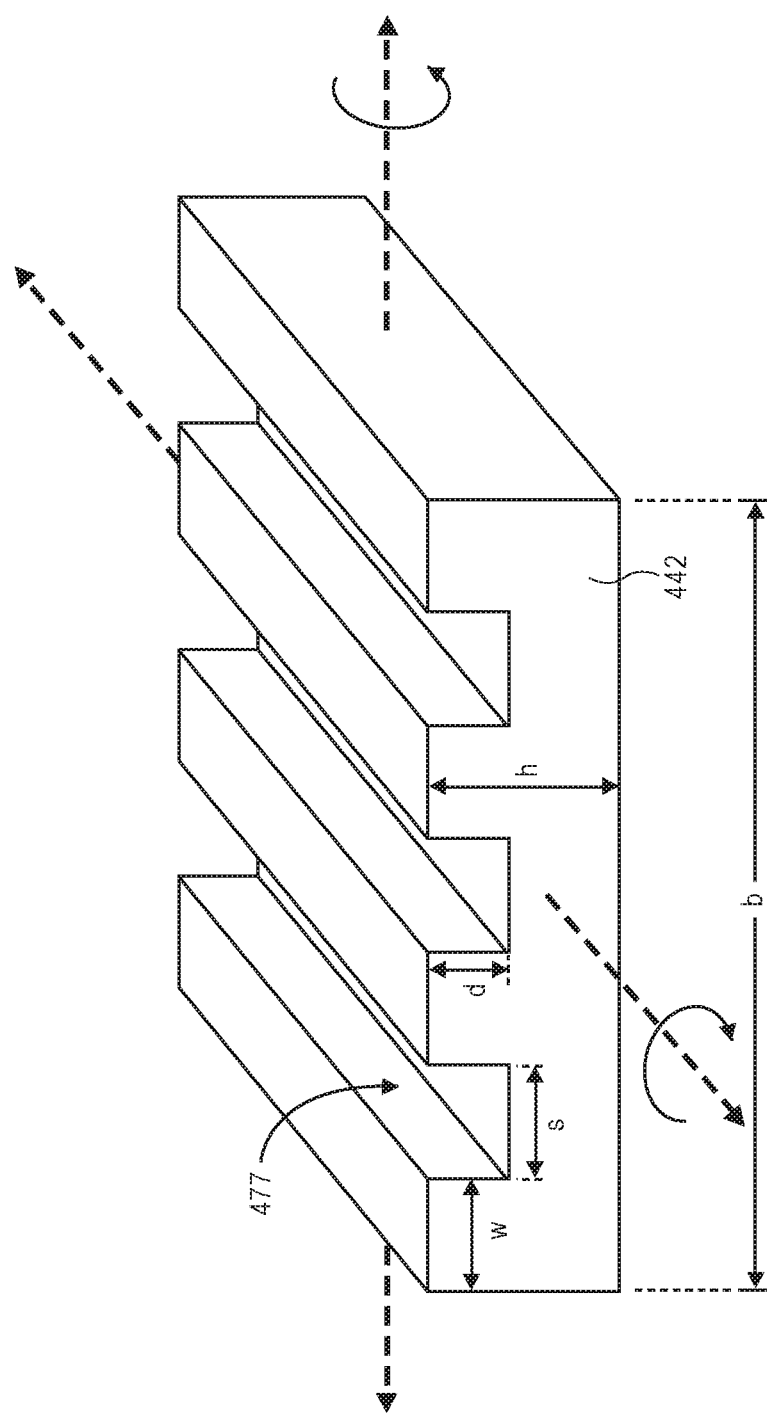
FIG. 4 is a perspective illustration of a pattern formed in the resonating body or a lid, in accordance with an embodiment.

Referring now to FIG. 4, a perspective illustration of the diaphragm 442 is shown after being processed with a processing operation. The diaphragm 442 is shown in isolation in order to not obscure the figure. In an embodiment, the second resonant mode results in the diaphragm 442 bending about a line parallel to the direction of the trenches 477. In an embodiment, the third resonance mode results in the diaphragm 442 bending about a line perpendicular to the direction of the trenches 477. Initially, prior to etching the diaphragm that is substantially square, the resonant frequencies of the second and third resonance modes will be substantially uniform (since there are no trenches formed). After the trenches begin to be formed, the resonant frequencies of the second and third resonance modes begin to diverge. In a simplified lump model, the resonant frequency $\omega$ of the diaphragm is proportional to the moment of inertia I, as shown in Equation 1 where E is the modulus and m is the mass. Accordingly, as the moment of inertia I of each bending direction changes, so does the resonant frequency.

$$\omega \sim \sqrt{\frac{EI}{m}} \qquad \text{Equation 1}$$

The divergence of the resonant frequencies of the second and third resonance modes is the result of the moment of inertia about each bending direction changing in response to the changes in the topography of the diaphragm 442. Equations for calculating the moment of inertia about each bending direction can be modeled for expected topographies and even more accurate models may be numerically solved. For example, in a square diaphragm with a series of parallel trenches with a 1:1 trech:ridge ratio, the moment of inertia $I_{PARALLEL}$ is shown in Equation 2 and the moment of inertia $I_{PERPENDICULAR}$ is shown in Equation 3. It is to be appreciated that the equations disclosed herein are simplified lump models. Equations 1 and 2 do, however, illustrate magnitudes of various variables of the process. For example, the depth d in $I_{PERPENDICULAR}$ is cubed, whereas the d in the $I_{PARALLEL}$ is not raised to a higher power. Since the resonant frequencies for each mode are determined from the micro resonator sensor, the system of equations may then be solved to determine the missing parameters that provide the topography of the diaphragm 442.

$$I_{PARALLEL} = \frac{bh^3}{12} - \frac{bdh^2}{8} \qquad \text{Equation 2}$$

$$I_{PERPENDICULAR} = \frac{b(h-d)^3}{12} \qquad \text{Equation 3}$$

Figure 5A:
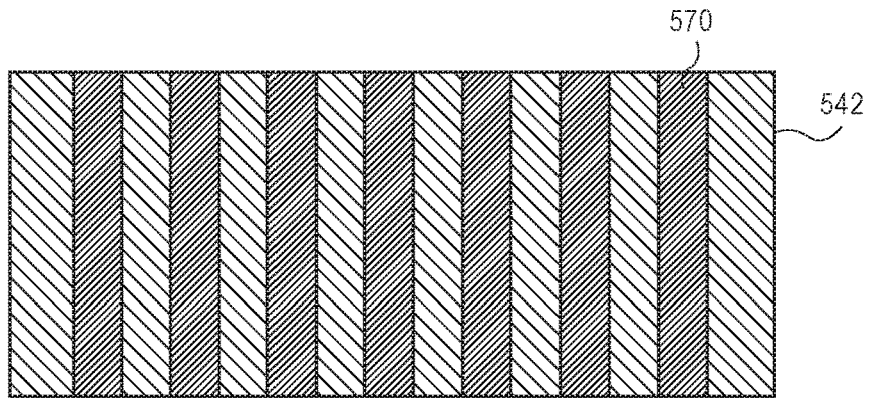
FIG. 5A is a plan view of a mask pattern formed over the resonating body, in accordance with an embodiment.
Figure 5B:
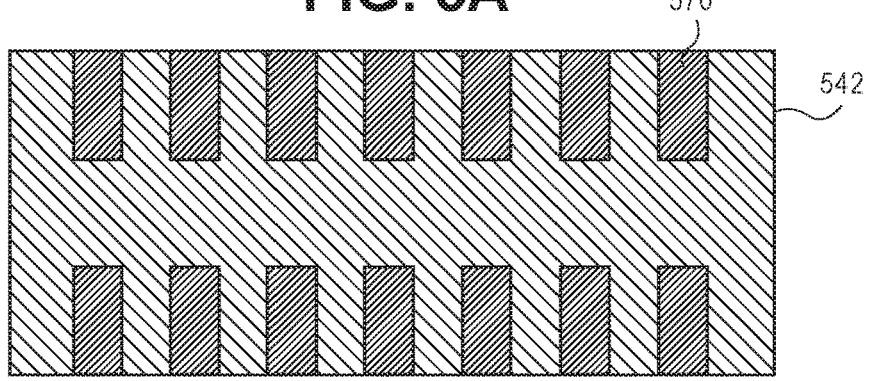
FIG. 5B is a plan view of a mask pattern formed over the resonating body, in accordance with an additional embodiment.
Figure 5C:
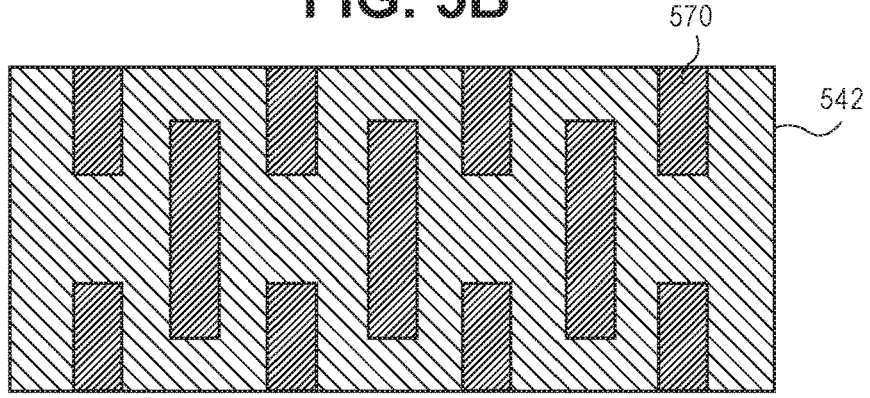
FIG. 5C is a plan view of a mask pattern formed over the resonating body, in accordance with an additional embodiment.
Figure 5D:
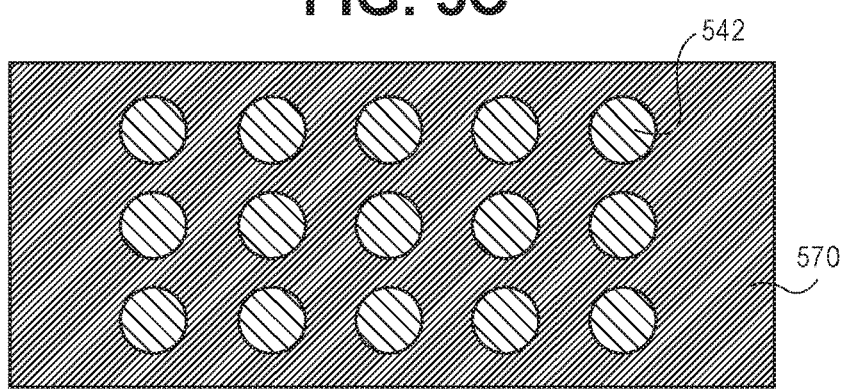
FIG. 5D is a plan view illustration of a mask pattern formed over the resonating body, in accordance with an additional embodiment.

While the scenario of parallel trenches is provided above, it is to be appreciated that embodiments may include any patterned topography. For example, FIGS. 5A-5C provide exemplary illustrations of different mask patterns 570 that may be transferred into the diaphragm 542. In FIG. 5A, a series of parallel trenches are shown. In FIG. 5B, a pattern 570 with discontinuous trenches is shown. Furthermore, FIG. 5C illustrates a pattern 570 for forming interdigitated trenches is shown. In FIG. 5D, a pattern 570 for forming a plurality of holes is shown. While FIGS. 5A-5D provide a few examples of mask patterns 570, it is to be appreciated that any pattern may be used in accordance with embodiments described herein. In order to use a pattern, embodiments only require that a model of moments of inertia for a plurality of resonance modes be generated. For example, the modeled moments of inertia may include computer generated models that are far more complex than the examples provided in Equations 1-3. Furthermore, as the complexity of the model is increased, and the number of resonance modes increased, finer details of the topography of the diaphragm may be obtained. For example, the taper of a trench may be determined, the presence of undercuts or footings may be determined, or the like.

While FIGS. 4 and 5A-D describe the mechanism for relating the resonant frequency to the shape of a diaphragm (i.e., a micro resonator 240 such as those described in FIGS. 2A and 2B), substantially similar mechanisms allow for the resonant frequency of buried resonator bodies to be related to the shape of the lid to which the buried resonator bodies are mechanically coupled (i.e., similar to resonator bodies 345 in FIGS. 3A-3H).

Figure 6A:
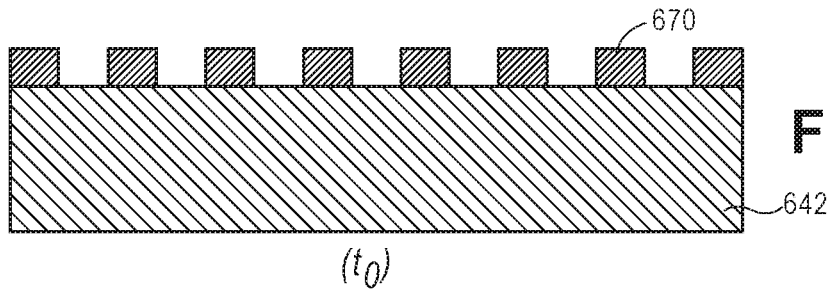
FIG. 6A is a cross-sectional illustration of a mask pattern formed over the resonating body at a time $t_0$, in accordance with an embodiment
Figure 6B:
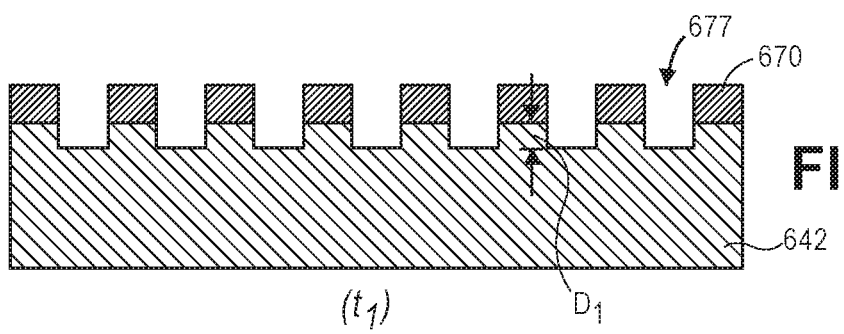
FIG. 6B is a cross-sectional illustration of the resonating body at a time $t_1$, in accordance with an embodiment.
Figure 6C:
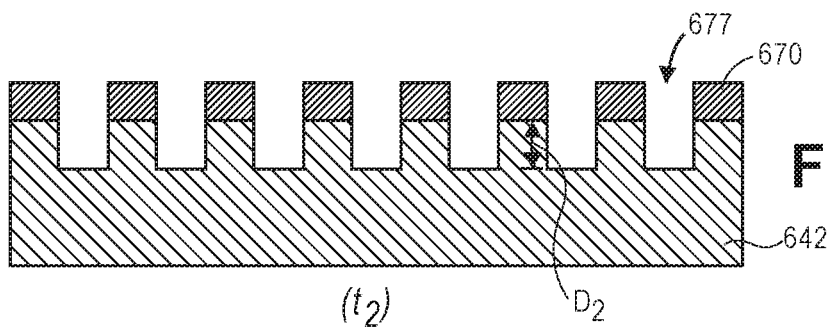
FIG. 6C is a cross-sectional illustration of the resonating body at a time $t_2$, in accordance with an embodiment.
Figure 6D:
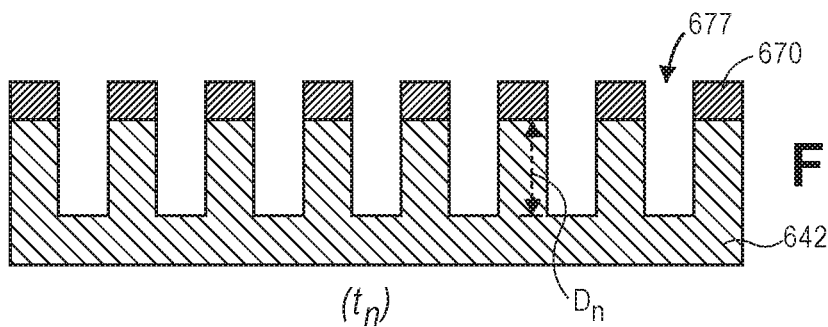
FIG. 6D is a cross-sectional illustration of the resonating body at a time $t_n$, in accordance with an embodiment.
Figure 7:
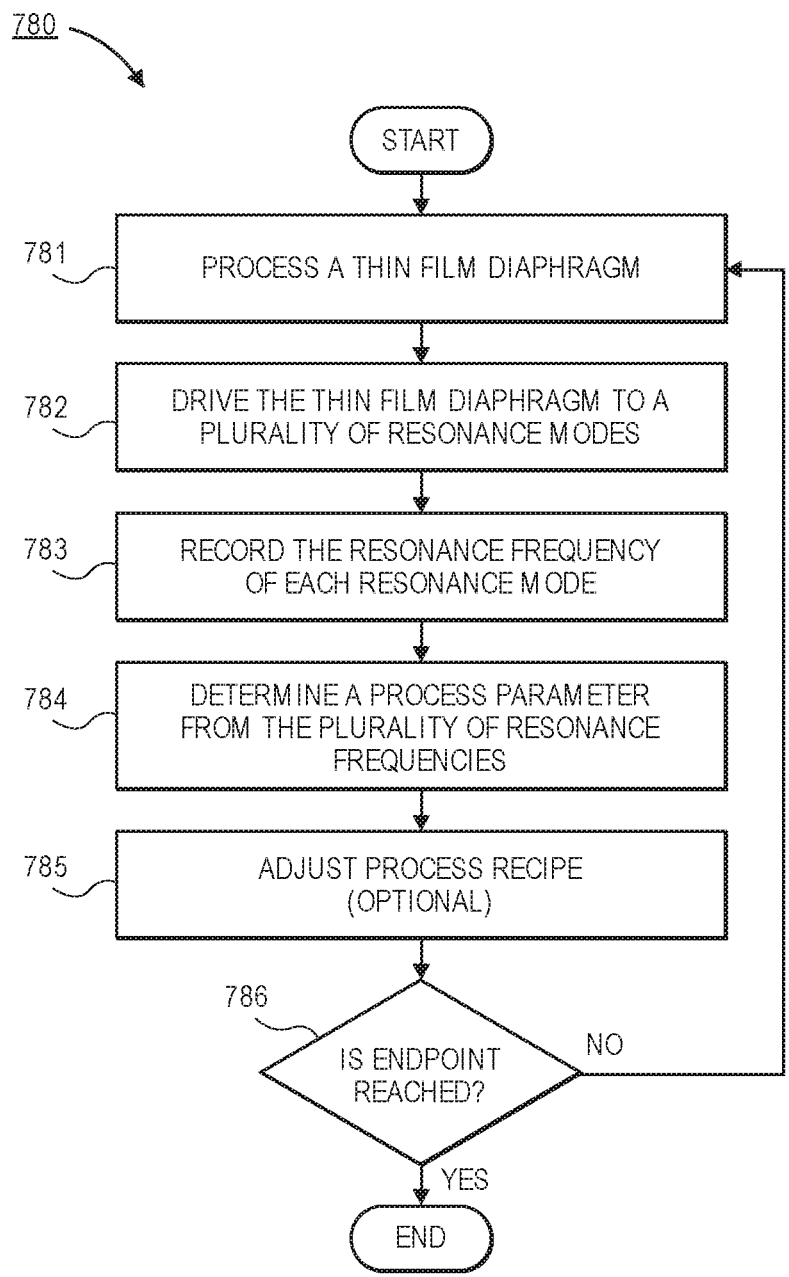
FIG. 7 is a process flow of a process for determining process parameters of a processing operation, in accordance with an embodiment.

Referring now to the cross-sectional illustrations in FIGS. 6A-6D and corresponding flow diagram in FIG. 7, a method for determining a process parameter of a processing operation is shown and described, in accordance with an embodiment. In FIGS. 6A-6D the patterned surface is referred to as being a diaphragm 642. However, it is to be appreciated that substantially similar processes may be implemented over a capping layer to which a resonator body is mechanically coupled (e.g., similar to the embodiments illustrated in FIGS. 3A-3H), in accordance with additional embodiments.

FIG. 6A is a cross-sectional illustration of a diaphragm 642 with a mask pattern 670 formed over the surface, in accordance with an embodiment. The diaphragm 642 may be a portion of a micro resonator sensor in a diagnostic substrate, such as one described above. In the illustrated embodiment, the diaphragm 642 is shown at time $t_{(0)}$ prior to any processing.

Referring now to FIG. 7, the process 780 may begin with operation 781 which includes processing the diaphragm 642. The processed diaphragm 642 after a time $t_{(1)}$, is shown in FIG. 6B. In an embodiment, processing the diaphragm 642 may include any processing operation that is being investigated with the diagnostic substrate. For example, the processing operation may be an etching process, a deposition process, a polishing process, an implantation process, or any other process that alters the topography of the diaphragm 642.

Referring now to operation 782, process 780 may continue with driving the diaphragm 642 to a plurality of resonance modes by applying a drive signal to the micro resonator. For example, the drive signal may comprise a frequency sweep (also referred to as a "chirp"), a ping, or the like. The drive signal causes oscillation of the diaphragm 642. The oscillation of the diaphragm 642 may be sensed by a sensing circuitry block (not shown). For example, the oscillation may result in an impedance change in the circuit (e.g., when a chirp is used), or the oscillations may simply be counted (e.g., when a ping is used). In an embodiment, the diaphragm 642 may be driven to a plurality of resonance modes with electrodes in the micro resonator sensor. In a particular embodiment, the diaphragm 642 may be driven to a first resonance mode, a second resonance mode, and a third resonance mode.

Referring now to operation 783, process 780 may continue with recording the resonance frequency of each of the plurality of resonance modes. In an embodiment, the resonance frequencies of each of the resonance modes may be recorded in a memory that is local to the diagnostic substrate. In an additional embodiment, the resonance frequencies may be transmitted to an external memory, (e.g., with a wireless communication module on the diagnostic substrate).

Referring now to operation 784, process 780 may continue with determining a process parameter from the plurality of resonance frequencies. In an embodiment, the process parameter may include an etch depth, a width of a trench, a profile of a trench wall, a thickness of a deposited layer, or any other change in the diaphragm 642. The process parameter may be determined by using the plurality of resonance frequencies and models for the moments of inertia for each of the bending directions of the resonance modes, similar to the process described above with respect to FIG. 4.

Referring now to operation 785, process 780 may continue with adjusting a process recipe of the processing operation. For example, temperatures, pressures, gas flows, or the like may be changed. The ability to change the processing recipe in situ allows for greater refinement of the processing operation and provides more information about the processing operation.

Referring now to operation 786 process 780 may continue with determining if an endpoint is reached. For example, the endpoint may be a desired time, a desired process parameter, or any other desired criteria. When the endpoint is not reached, the process may continue with repeating the processing operations 781-786 until the endpoint criteria is reached. For example, the process may repeat to determine the processing parameter after times $t_2$ to $t_n$ illustrated in FIGS. 6C-6D.

As noted above, the ability to determine the processing parameters in-situ allow for the rates of change of the processing parameter to be determined. Accordingly, greater detail about the processing operation under investigation may be obtained in comparison to the information obtained by performing metrology after the processing operation is completed.

Furthermore, it is to be appreciated that the process 780 may be implemented with a plurality of micro resonator sensors formed over the surface of the diagnostic substrate. For example, tens of thousands of micro resonator sensors in each of a plurality of sensing regions of the diagnostic substrate may be used in parallel to obtain uniformity information of the processing operation. In such embodiments, operation 784 may further include finding an average value of the processing parameter in each sensing region. The large quantity of micro resonator sensors in each sensing region allow for high precision and resolution due to the favorable signal to noise ratio obtained by processing the information obtained from each micro resonator.

In other embodiments, differential comparisons of resonance frequency of pairs of micro resonator sensors may be implemented. For example, differential comparisons may be used to determine temperatures, surface potentials, and/or pressures of the capping surface. Such differential comparisons may be implemented by using a pair of micro resonator sensors where one of the pair is used as a control to isolate one or more variables. For example, in the case of a surface potential, a bias may be applied to a first micro resonator and the second micro resonator sensor may be shorted (i.e., no bias is applied) to isolate the surface potential variable.

Figure 8:
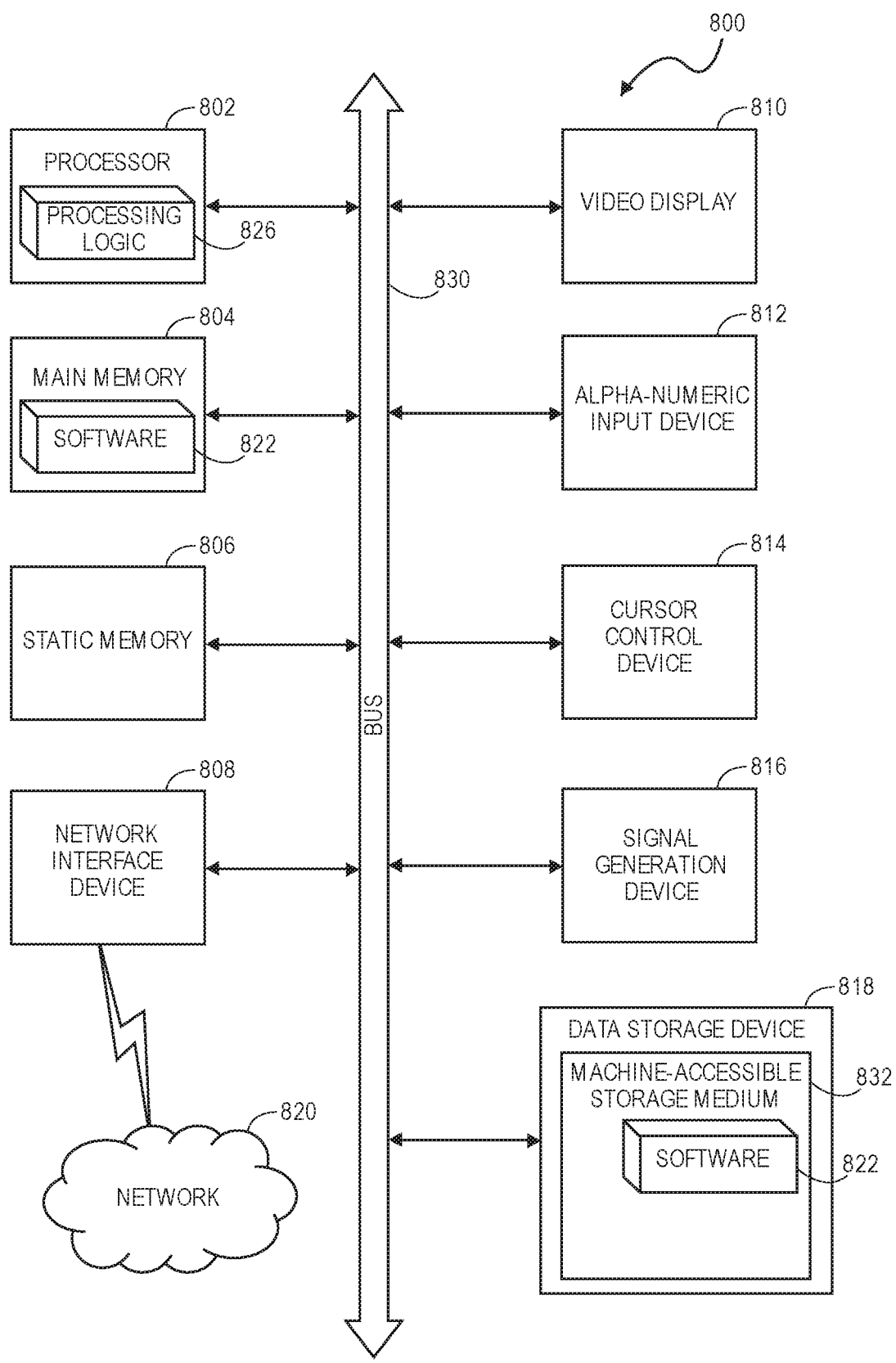
FIG. 8 illustrates a block diagram of an exemplary computer system that may be used in conjunction with processes for determining process parameters of a processing operation, in accordance with an embodiment.

Referring now to FIG. 8, a block diagram of an exemplary computer system 860 of a processing tool is illustrated in accordance with an embodiment. In an embodiment, computer system 860 is coupled to and controls processing in the processing tool. Computer system 860 may be connected (e.g., networked) to other machines in a Local Area Network (LAN), an intranet, an extranet, or the Internet. Computer system 860 may operate in the capacity of a server or a client machine in a client-server network environment, or as a peer machine in a peer-to-peer (or distributed) network environment. Computer system 860 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 860, the term "machine" shall also be taken to include any collection of machines (e.g., computers) that individually or jointly execute a set (or multiple sets) of instructions to perform any one or more of the methodologies described herein.

Computer system 860 may include a computer program product, or software 822, having a non-transitory machine-readable medium having stored thereon instructions, which may be used to program computer system 860 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 860 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 860 may further include a system network interface device 808 for communicating with other devices or machines. The computer system 860 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 831 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 860, the main memory 804 and the system processor 802 also constituting machine-readable storage media. The software 822 may further be transmitted or received over a network 820 via the system network interface device 808. In an embodiment, the network interface device 808 may operate using RF coupling, optical coupling, acoustic coupling, or inductive coupling.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A diagnostic substrate, comprising:
   a substrate having a top surface;
   a circuit layer over the top surface of the substrate;
   a capping layer over the circuit layer, wherein the capping layer comprises a semiconductor material; and
   a micro resonator sensor in the circuit layer and the capping layer, wherein the micro resonator sensor comprises:
   a resonating body; and
   one or more electrodes for inducing resonance in the resonating body,
   wherein the one or more electrodes are beneath the resonating body in a location vertically between the top surface of the substrate and the resonating body.

2. The diagnostic substrate of claim 1, wherein the resonating body is a diaphragm.

3. The diagnostic substrate of claim 2, wherein the diaphragm is part of the capping layer and extends over a cavity in the circuit layer.

4. The diagnostic substrate of claim 3, wherein the one or more electrodes are positioned along a floor of the cavity.

5. The diagnostic substrate of claim 3, wherein the diaphragm provides a vacuum seal over the cavity.

6. The diagnostic substrate of claim 1, further comprising:
   an antenna, wherein the antenna is configured to passively couple the one or more electrodes to a wireless power source.

7. The diagnostic substrate of claim 6, wherein the antenna is further configured to passively couple the one or more electrodes to a wireless frequency source.

8. The diagnostic substrate of claim 1, wherein the one or more electrodes comprises at least four electrodes.

9. The diagnostic substrate of claim 1, further comprising:
   a processing region electrically coupled to the micro resonator sensor, wherein the processing region comprises circuitry for driving and sensing resonance frequencies of the micro resonator.

10. A diagnostic substrate, comprising:
    a substrate having a top surface;
    a circuit layer over the top surface of the substrate;
    a cavity in the circuit layer;
    a capping layer over the circuit layer wherein a portion of the capping layer seals the cavity, and wherein the capping layer comprises a semiconductor material; and a micro resonator in the cavity, wherein the micro resonator comprises:
  a resonating body, wherein the resonating body is mechanically coupled to the portion of the capping layer sealing the cavity; and
  one or more electrodes for inducing resonance in the resonating body, wherein the one or more electrodes are beneath the resonating body in a location vertically between the top surface of the substrate and the resonating body.

11. The diagnostic substrate of claim 10, wherein the resonating body is mechanically coupled to a floor of the cavity.

12. The diagnostic substrate of claim 10, wherein the one or more electrodes are in plane with the resonating body.

13. The diagnostic substrate of claim 10, wherein the one or more electrodes are out of plane with the resonating body.

14. The diagnostic substrate of claim 10, wherein the resonating body is a tuning fork, a comb drive, a cantilever beam, or a ring.

15. The diagnostic substrate of claim 14, wherein the resonating body is mechanically coupled to the portion of the capping layer sealing the cavity at one location.

16. The diagnostic substrate of claim 14, wherein the resonating body is mechanically coupled to the portion of the capping layer sealing the cavity at more than one location.

17. A diagnostic substrate, comprising:
a substrate having a top surface;
a circuit layer over the top surface of the substrate;
a capping layer over the circuit layer, wherein the capping layer comprises a semiconductor material; and
a plurality of sensing regions across the diagnostic substrate, wherein each sensing region comprises:
  a plurality of cavities formed into the circuit layer;
  a plurality of electrodes formed in each of the cavities; and
  a resonating body over or within each of the cavities, wherein the plurality of electrodes is beneath the resonating body in a location vertically between the top surface of the substrate and the resonating body.

18. The diagnostic substrate of claim 17, wherein there are at least one hundred sensing regions, and wherein there are at least one thousand cavities in each sensing region.

19. The diagnostic substrate of claim 17, wherein the resonating body is a diaphragm over each cavity, and wherein the resonating body is part of the capping layer.

20. The diagnostic substrate of claim 17, wherein a portion of the capping layer seals each cavity, wherein the resonating body is within each cavity, and wherein the resonating body is mechanically coupled to the portion of the capping layer sealing each cavity.

* * * * *